United States Patent [19]
Consiglio

[11] Patent Number: 5,804,977
[45] Date of Patent: Sep. 8, 1998

[54] TRANSMISSION LINE PULSER DISCHARGE CIRCUIT

[76] Inventor: Rosario J. Consiglio, 1144 N. 2nd St., San Jose, Calif. 95112

[21] Appl. No.: 838,969

[22] Filed: Apr. 23, 1997

[51] Int. Cl.$^6$ ................................................... G01R 27/26
[52] U.S. Cl. .......................... 324/678; 324/676; 324/765; 333/20
[58] Field of Search ..................................... 324/637, 678, 324/676, 765, 602; 333/20

[56] References Cited

U.S. PATENT DOCUMENTS

| | | | |
|---|---|---|---|
| 5,410,254 | 4/1995 | Consiglio | 324/456 |
| 5,519,327 | 5/1996 | Consiglio | 324/678 |

OTHER PUBLICATIONS

N. Khurana, T. Maloney, W. Yeh ESD on CHMOS Devices—Equivalent Circuits, Physical Models and Failure Mechanisms, 1985 IEEE/IRPS.

T.J. Maloney and N. Khurana Transmission Line Pulsing Techniques for Circuit Modeling, 1985 EOS/ESD Symposium.

*Primary Examiner*—Ernest F. Karlsen
*Assistant Examiner*—Thomas Valone
*Attorney, Agent, or Firm*—Patrick T. King

[57] ABSTRACT

An RF matching network provides matching between a charged first transmission line and a relay circuit which is switched to connect the charged transmission line to one end of a second transmission line to generate a high-voltage, high-current test pulse for a DUT connected to the other end of the second transmission line. A low pass filter section of the RF matching network suppresses transient and ringing signals which might pass through the parasitic capacitance of the relay circuit and which trigger the prematurely trigger the DUT. To remove residual charge after discharging the first transmission line, the transmission line is grounded with a GND relay before leakage tests are conducted to prevent electrically stress of destruction of leakage testing circuitry if the residual charge is not dissipated before testing for leakage. Termination resistors for the first transmission line are made of material, such as ceramic, that will not change characteristics with high current and will not breakdown in the presence of high electric fields.

5 Claims, 5 Drawing Sheets

TRANSMISSION LINE PULSER DISCHARGE CIRCUIT

BACKGROUND OF THE INVENTION

1. Field of the Invention

This invention relates to test equipment for semiconductor devices and, more particularly, to a transmission-line pulser circuit for testing semiconductor devices.

2. Prior Art

A transmission line pulsing technique is used to generate short-duration, high current pulses to probe-test electrostatic discharge (ESD) performance of a semiconductor device. The transmission line pulsing technique charges the distributed capacitance of a transmission line and then discharges the line to produce a voltage pulse having a duration time equal to 2 1/c, where 1 is the length of the line and c is the propagation velocity of the transmission line.

In previous designs of transmission-line pulser test equipment for probe-testing of semiconductor devices, a so-called recharge transient problem has arisen. For the recharge transient problem, a charge-storing element, such as the capacitance of a transmission line, is switched between a high voltage source and a device under test (DUT). The transmission line, which provides the charge-storage capacitance, has one terminal connected to ground and its other terminal connected to the movable arm terminal of a double-pole, single-throw relay. One contact of the relay is connected to the high-voltage source through a high resistance and the other contact of the relay is connected to a probe connected to a device under test (DUT). A small shunt capacitance exists between the two relay contacts, so that, when the transmission line is connected to the high-voltage source to charge the charge-storage capacitance of the transmission line, the shunt capacitance across the relay contacts allows a displacement current to travel to the DUT. This displacement current is given by $I_x(t) = C_x\, dv/dt$, where $C_x$ is the small shunt capacitance across the two relay contacts. The effect of this is put an uncontrolled amount of electrical stress on the DUT, which skews the effect of a subsequent test pulse.

Another problem associated with transmission-line pulser test equipment for probe-testing of semiconductor DUTs is the effect of leakage current caused by a voltage measurement probe used to measure voltage across the DUT. A constant voltage source forces a voltage on the DUT and the resultant leakage current through the DUT is then measured. The voltage probe measures the voltage applied by the constant voltage source across the DUT. If the resistance of the DUT is much greater than the resistance of the voltage probe, more current will flow through the lower resistance of the voltage probe than through the higher resistance of the DUT. As a result, the current flowing through the voltage probe will mask the leakage current through the DUT.

Current transmission-line pulser test equipment for probe-testing of semiconductor devices provide a method of discharging a transmission line with sufficient current to model devices for a United States standard called the Human Body Model (HBM) ESD Standard. In recent years, the ESD testing market has become internationally competitive and New European ESD standards such as the IEC 100-4-2 ESD Standard have been developed. These new standards require currents which are an order of magnitude greater than the currents for the US Standard. Consequently, prior techniques for discharging a transmission line have proved to be inadequate for accurately modeling device behavior at the higher current conditions. In addition, parasitic inductances and capacitances which are inherent in the prior art discharge circuits create undesirable reflections which distort the wave forms showing device behavior.

Consequently, the need has arisen for a technique for testing a semiconductor device which provides for much greater test currents and which reduces undesirable reflections.

SUMMARY OF THE INVENTION

It is therefore an object of the invention to provide a cost-effective, accurate improved transmission line pulser discharge circuit and technique which provide for much greater test currents and which reduce unwanted reflections.

The invention provides a new high-current pulse discharge circuit which includes an RF matching circuit, a grounding circuit, and high-voltage, high-current terminations.

The RF matching network, which includes a low pass filter for reducing any unwanted charging transient signals which might pass through the parasitic capacitance of a switching relay. The RF matching network also slows the rate of rise of the discharge waveform to mitigate ringing at the leading edge of the discharge waveform. A device is tested by increasing the amplitude of the test pulse in steps of 20 to 50 volts up to, for example, 2500 volts. Undesirable ringing on a test pulse produces voltage levels which trigger the DUT before it is desired.

In the event that residual charge remains present in the discharge circuit after discharging the transmission line, the transmission line is grounded with a GND relay before leakage tests are conducted. Residual charge is commonly left if the DUT has not turned on and dissipated the test charge. This residual charge can mask the leakage characteristics of a device. This residual charge can also either electrically stress or destroy leakage testing circuitry if the residual charge is not dissipated before testing for leakage.

Finally, high currents alter the characteristics of the component used in the discharge test circuit. In particular, termination diodes are cascoded, high-breakdown, fast recovery devices. Carbon or thin film termination resistors will not work because these types of resistors will be too large in size to provide sufficient termination and matching at high current and high voltage levels. These termination resistors must be made of material, such as ceramic, that will not change characteristics with high current and will not breakdown in the presence of high electric fields.

A pulse discharge system for testing a DUT such as an integrated-circuit device. A first switch S1 has a common terminal with series inductance. S1 has a first contact terminal and a second contact terminal with series lead inductance. The common terminal of the first switch S1 is connected to one end of a first transmission line. The second end of the first transmission line is coupled to one or more stable, high-current termination resistors which are made of material, such as ceramic, that will not change characteristics with high current and will not breakdown in the presence of high electric fields.

The first contact terminal of the first switch S1 is connected to a high voltage source for charging the first transmission line to the high voltage. In its first position, the second contact terminal of the first switch S1 is connected to an input terminal of an RF matching network. In its second discharging position, the switch S1 connects the transmission line to the input terminal of the RF matching network and generates a test pulse. The test pulse propagates through the RF matching network which matches the impedance of the series combination of the first transmission line and the series inductances of the common terminal.

The RF matching network has an output terminal to which is connected one terminal of a second switch S2 which connects a means for testing leakage to the system.

The output terminal of the RF matching network is also connected to one terminal of a third switch S3 which connects the system to a ground reference potential prior to leakage testing. This grounding removes residual charge remaining in the discharge circuit after discharging the transmission line into the DUT if the DUT has not turned on and dissipated the test charge.

The output terminal of the RF matching network is also connected to one end of a second transmission line. A second end of the second transmission line is connected to a DUT such as, for example, an integrated-circuit.

Means are provided for measuring reflected voltage and reflected current from the DUT at the output terminal of the RF matching network. Voltage sensor are means coupled to the output terminal of the RF matching circuit for measuring any reflected voltage which propagates from the DUT as a result of the pulse applied to the DUT. Current sensor means are coupled to the output terminal of the RF matching circuit for measuring any reflected current which propagates from the DUT as a result of the pulse applied to the DUT. Means are provided for dividing the measure reflected voltage by the measured reflected current to provide dynamic impedance for a point of the DUT being contacted with a test probe connected to the second end of the first conductor of the second transmission line. Voltage and current measurements as well as division of the signals is accomplished, for example, using an oscilloscope with A/B capability.

A controller operates the first switch S1, the second switch S2, and the third switch S3 in proper sequence.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1A is a simplified equivalent circuit diagram of a prior art pulse generator circuit which uses the capacitance of a transmission line to store charge and which switches one terminal of the transmission line between two relay contacts which have a shunt capacitance there between.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1A:
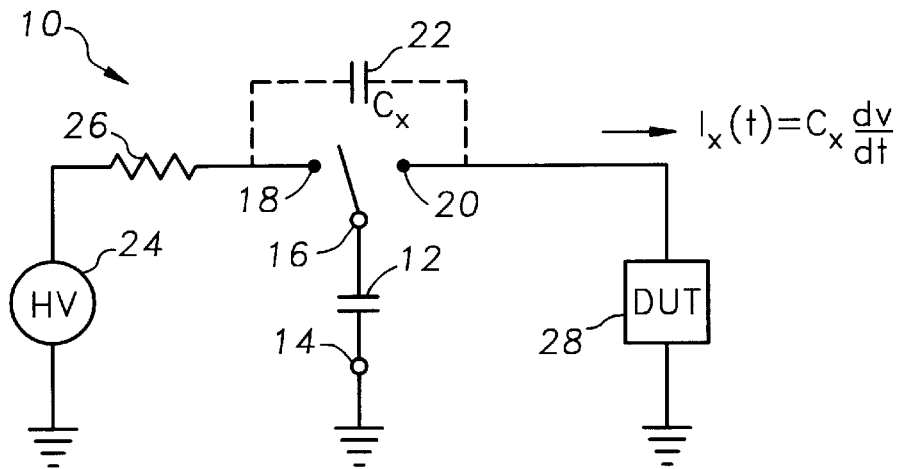

FIG. 1A is a simplified diagram of an equivalent circuit 10 of a prior art pulse generator circuit which uses the capacitance 12 of a transmission line to store charge and which uses the distributed inductive and capacitive elements of the transmission line to generate a pulse. One conductor of the transmission line, which is represented as a capacitor, is connected to a ground terminal 14. The other conductor of the transmission line is connected to the switch-arm terminal 16 of a relay. The relay has two contacts 18, 20. The contacts have a small shunt capacitance $C_x$ between them. The relay contact 18 has a high voltage source 24 connected through it through a series resistance 26. When the relay switch arm is connected between terminal 16 and 18, the high voltage source 24 charges the capacitance 12 of the transmission line through the series resistor 26 to the value of the high voltage supply 24. When the relay is switched so that the switch arm of the relay provides connection between terminal 16 and the relay contact 20, the charge stored on the capacitance 12 of the transmission line is discharged from the line into a Device Under Test (DUT) 28. A DUT is typically an integrated-circuit. For the recharge transient problem associated with this type of circuit, when the capacitance 12 of the transmission line is switched between the high voltage source 24 and the DUT 28, the small shunt capacitance 22 between the two relay contacts 18, 20 allows a displacement current to travel to the DUT 28. This displacement current is given by $I_x(t)=C_x\, dv/dt$, where $C_x$ is the small shunt capacitance across the two relay contacts. The effect of this displacement current is to put an uncontrolled amount of electrical stress on the DUT, which skews the effect of a subsequent test pulse from the transmission-line pulse generator.

Figure 1B:
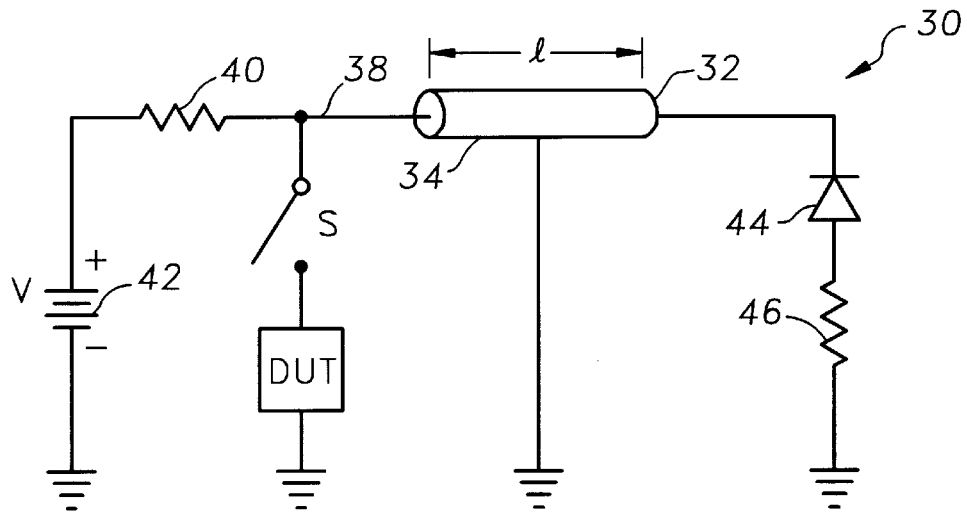
FIG. 1B is a simplified equivalent circuit diagram of a prior art pulse generator circuit which uses the capacitance of a transmission line to store charge and which switches a DUT to the input terminal of a charged transmission line.

FIG. 1B is a circuit diagram of a prior art pulse generator circuit 30 which uses the capacitance of transmission line 32 having a length 1 to store charge. For a co-axial transmission line 32, the outer conductor 34 is connected to a ground terminal 36. The center conductor 38 of the transmission line has one end connected through a 10 Megohm resistor 40 to the positive terminal of a voltage source 42. The negative terminal of the voltage source 42 is connected to the ground terminal 36 of the circuit. The other end of the center conductor 38 of the transmission line 32 is connected to the cathode terminal of a series diode 44. The anode terminal of the series diode 44 is connected through a load resistor circuit 46 to the ground terminal 36. The diode 44 provides a unipolar test pulse. The load resistor 36 matches the impedance of the transmission line 32.

Figure 2:
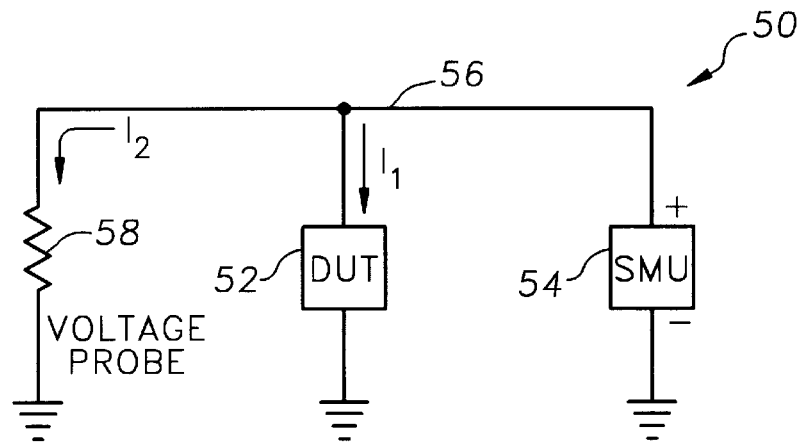
FIG. 2 is a simplified equivalent circuit diagram of a circuit for testing leakage current through a DUT, where the DUT is shunted with the resistance of a voltage measurement probe.

FIG. 2 shows a for a simplified equivalent circuit 50 for forcing a test voltage on a DUT 52 from a Sense Measurement Unit (SMU) 54. The positive terminal of the SMU 54 is connected through a line 56 to the DUT 52. The negative terminal of the SMU 54 is connected to ground potential and the other terminal of the DUT 52 is connected to ground potential. A relatively high input impedance voltage probe is used to measure the voltage across the DUT 52. The voltage probe includes a 10 Megohm series resistance 58 which is shunted across the DUT 52 and across the positive terminal of the SMU 54 and the ground reference potential. A leakage current $I_1$ flows through the DUT 52 and is measured by the SMU 54. A shunt circuit $I_2$ flows through the shunt resistance 58 of the voltage probe. The SMU provides a constant voltage and measures the leakage current through the DUT and he voltage probe. If the resistance of the DUT 52 is much greater than the resistance 58 of the voltage probe, more current $I_2$ will flow through the lesser resistance of the voltage probe than will flow through the higher resistance of the DUT. As a result, the current $I_2$ flowing through the voltage probe resistance 58 will mask the leakage current $I_1$ through the DUT.

Figure 3A:
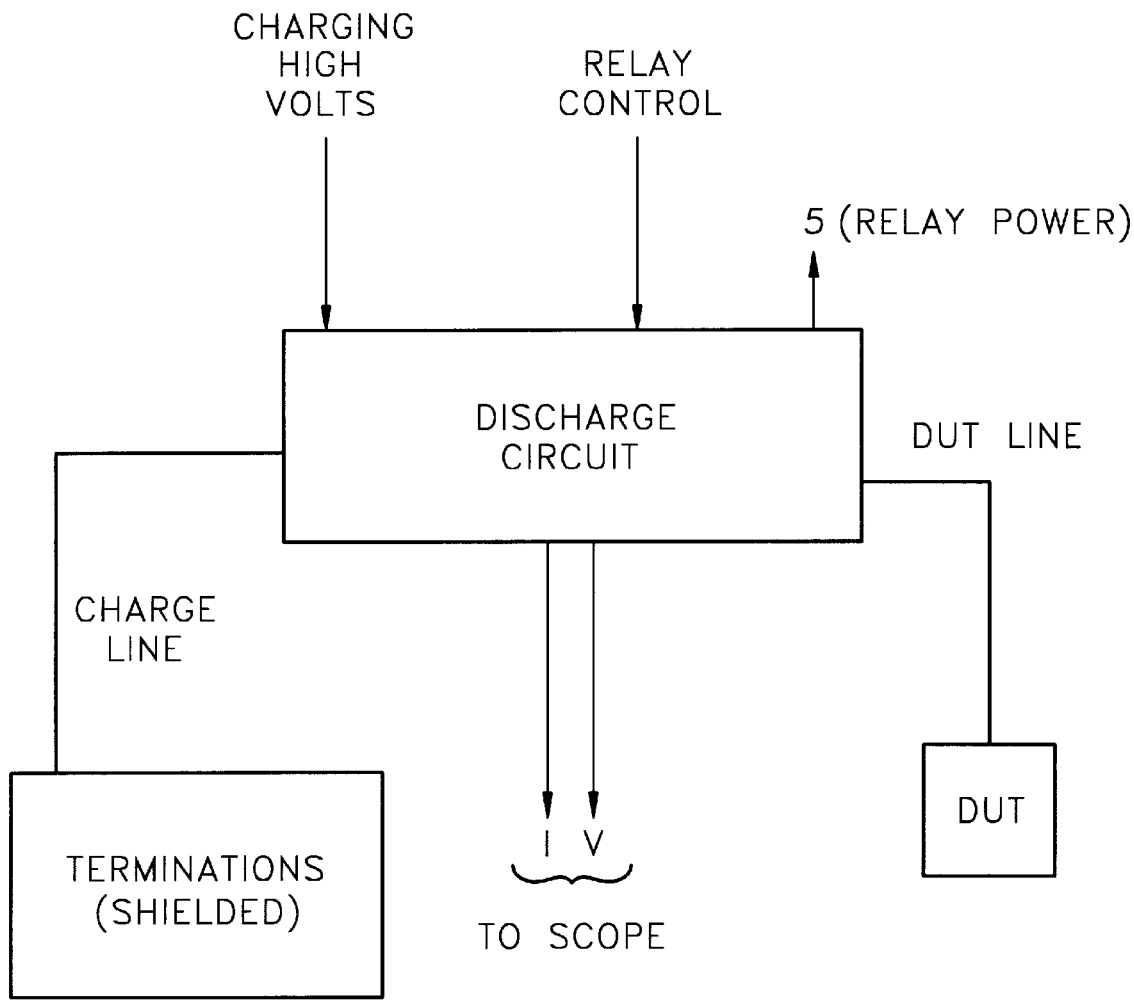
FIG. 3A is block diagram of a high-current transmission-line pulse discharge and leakage test system, according to the invention.

FIG. 3A is block diagram of a high-current transmission-line pulse discharge and leakage test system 60. A discharge circuit 62 has a high voltage charging input terminal 64 to which is connected, for example, a 2500 volt supply. A relay control bus 66 provides control signals to the discharge circuit 62. A terminal 68 is provided with 5 volt power for operating internal switches, or relays. A charging transmission line 70 is connected between the discharge circuit 62 and shielded line terminations 72. Current and voltage signals are provided at respective terminals 74, 76 to an oscilloscope for viewing and processing. An output transmission line 78 connected the discharge circuit 62 to a DUT 80.

Figure 3B:
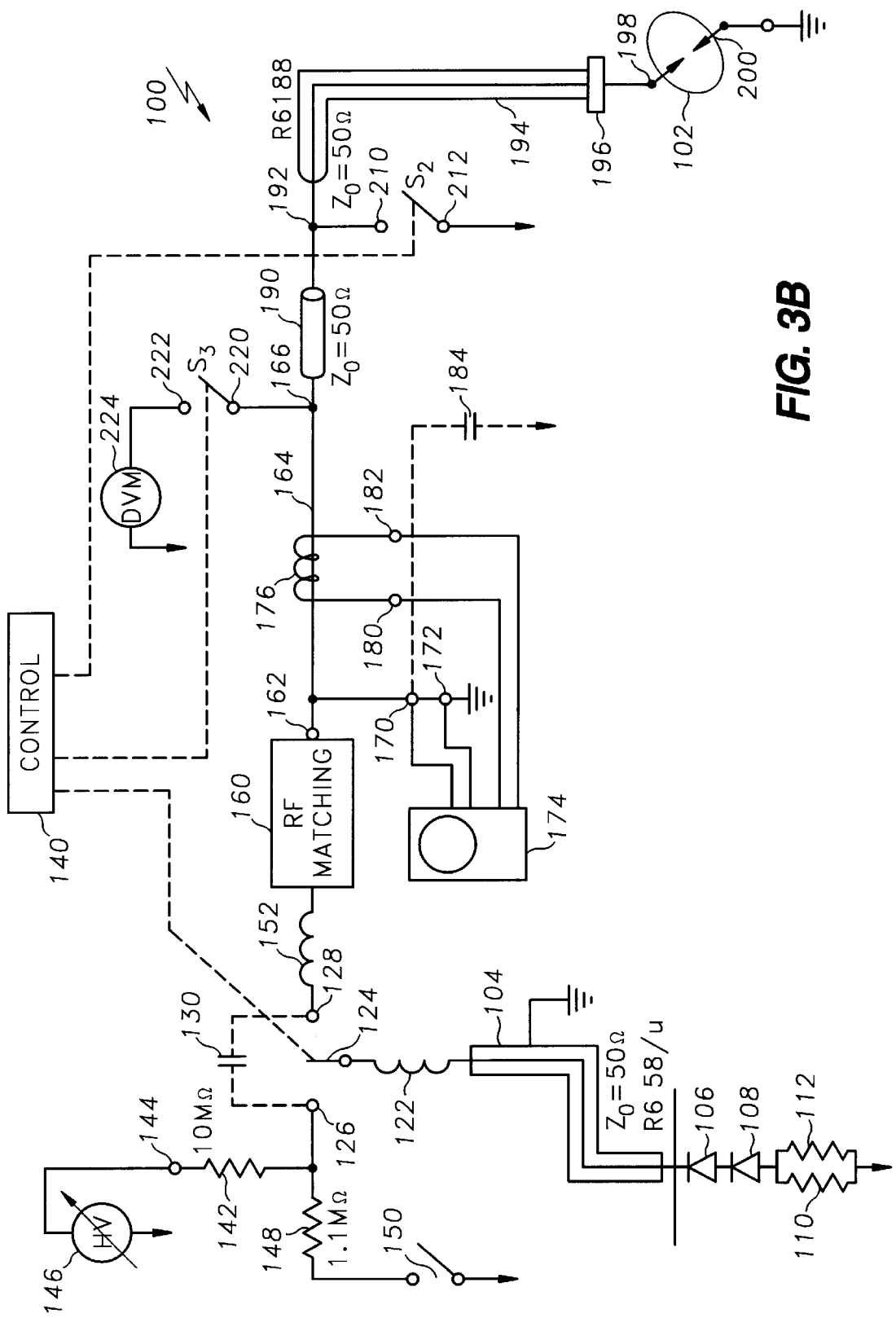
FIG. 3B is a more detailed circuit diagram of a high-current transmission-line pulse discharge circuit and leakage test circuit, according to the invention.

FIG. 3B illustrates a more detailed circuit diagram of a high-current transmission-line pulse discharge and leakage test circuit 100. Three separate switches, such as the relays S1, S2, and S3, are operated in predetermined sequences to provide TDR testing and leakage test to a DUT 102. The new discharge circuit 100 generates high quality high-current pulses from a charged first transmission line 104 which has its outer conductor connected to a ground reference point. The first transmission line 104 is, for example, a 50 ohm RG58/U coaxial cable which is terminated at one end with two series-cascoded, high-breakdown, fast-recovery termination diodes which are further in series with two parallel-connected, high-current, termination resistors. For high current applications, carbon or thin film termination resistors do not provide sufficient termination and matching at both high current and high voltage levels. The termination resistors 110, 112 are preferably made of material, such as ceramic, that does not change its characteristics with high current and will not breakdown in the presence of high electric fields, as required in this application.

The relay S1 has a common terminal 120 which is connected to the center conductor of the charging transmission line 104. The common terminal 120 is connected through a wire with a series lead inductance, typically represented by the inductor 122, to a movable contact arm 124 for the relay. The movable contact arm 124 relay S1 makes contact with either a normally closed NC contact 126 or a normally open NO contact 128 with a parasitic shunt capacitance 130 there between. The relay S1 is controlled by a controller 140 as indicated by the dotted line there between.

The NC contact 126 of S1 is connected to a high voltage source which includes a 10 Megohm series resistor 142 having one end connected to the NC contact 126 and the other end connected to a high voltage terminal 144 to which is connected to the output of a variable high voltage source 146. For test purposes, the output voltage of the high voltage source is fixed or can be increased in steps of 20 to 50 volts up to, for example, 2500 volts. A 10:1 voltage divider for the high voltage source is provided ass needed with a 1.1 Megohm shunt resistor 148 which is connected between the NC contact 126 and a manual grounding switch 150.

Switch S1 in a first charging operational state connects the center conductor of the transmission line 104 to the NC contact 126 and the high voltage source to thereby provide a conductive path for charging the capacitance of the transmission line 104 to a high-voltage state from the high voltage source. The transmission line 104, which has a length l forms a pulse with a width equal to 2 1/c.

The NO contact 128 of S1 is connected through a wire with a series lead inductance, typically represented by the inductor 152, to an NO output terminal 154 for the relay switch S1. The NO output terminal 154 is connected to an input terminal of an RF matching network 160.

Switch S1 in a second operational discharging state connects the NO contact 128 to the common terminal 120. In this switch position, the RF matching network 160 matches the impedance of the charged transmission line 10 and the series inductances 122, 152 of the common lead and the NO contact lead to the impedance presented to the output terminal 162 of the RF matching network. One embodiment of the RF matching network 160 also includes a low pass filter portion which quells any unwanted charging transient signals which might pass through the parasitic capacitance 130 of the relay S1 when S1 is switched from the NC contact 126 to the NO contact. One example of such a lowpass filter includes a 25–150 pf shunt capacitor and an inductance in series with the signal line. The RF matching network also slows the rate of rise of the discharge waveform to mitigate ringing at the leading edge of the discharge waveform.

The output terminal 162 of the RF matching network 160 is connected through a conductor 164 to a terminal 166. A measurement of the voltage V between the terminal 162 and the ground reference potential is taken between terminals 170 and 172 with, for example, with a measuring instrument 174, such as, for example, an oscilloscope or a time domain reflectometry (TDR) piece of measurement equipment. Measurement of the current passing through the conductor 164 is obtained with a current-sensing coil 176 coupled to the conductor 164, as indicated in the Figure. The current is measured by the voltage induced between test terminals 180, 182. The current is measured, for example, using a oscilloscope or a time domain reflectometry (TDR) piece of measurement equipment. The voltage and current measurements include both incident and reflected voltage and current wave forms. The input impedance of the oscilloscope 174 is represented by the capacitor 184 which has a value of, for example, 10 picofarads.

To find the dynamic impedance for a point of the DUT being measured, means are provided for dividing the measured reflected voltage as a function of time from the DUT by the measured reflected current as a function of time from the DUT. To find the dynamic impedance as a function of time for the DUT 102, the reflected voltage as a function of time is divided by the reflected current as a function of time, where the reflected voltage and reflected current are functions of time. This division is accomplished using, for example, the 174 in an input-A-divided-by-input-B (A/B) input display mode of an oscilloscope 174 and displaying the resultant dynamic impedance on the screen of the oscilloscope.

Terminal 166 one end of the center conductor of a rigid 50 ohm coaxial cable 190, which has its outer conductor grounded. The other end of the center conductor of the cable 50 is connected to a terminal 192. Terminal 192 is connected to the center conductor of a RG188 50 ohm cable 194, which has its outer conductor connected to a grounded panel 196 of the chassis for this test system. The other end of the transmission line 194 is coupled to a probe tip 198 which makes electrical contact to a point on the DUT 102. The DUT 102 is, for example, a semiconductor wafer 144. A probe tip 200 of another wafer probe provides a ground connection between a ground conductor on the DUT and a system ground reference terminal.

Relay S2 has a contact 210 connected to terminal 192. The terminal 212 for the movable contact arm of S2 is connected to the system ground reference potential. The transmission lines 190, 194 are grounded with the grounding relay S2 before leakage tests are conducted in the event that residual charge remains present in the pulse discharging circuit after discharging the stored energy in the transmission line 104. Residual charge is commonly left in the system if the DUT 102 has not turned on and dissipated the test charge. This residual charge can mask the leakage characteristics of a device. This residual charge can also either electrically stress or destroy the leakage circuitry if the residual charge is not dissipated before testing for leakage.

Terminal 166 is also connected to a contact-arm terminal 220 of the relay switch S3. The output contact of S3 is connected to a positive input terminal 224 of a digital voltmeter DVM 224. The negative terminal of the DVM is connected to a ground reference potential. Alternatively, a Sense Measurement Unit (SMU) provides a forced constant voltage at its positive terminal and includes a current sensing unit for measuring leakage current.

The three separate switches, such as the relays S1, S2, and S3 of this embodiment of the invention are operated in predetermined sequences. In operation, the switches S1, S2, and S3 are operated in a certain suitable sequence by the controller 140, which is, for example, a microcomputer, a digital logic circuit, or a similar sequence controller for pulse testing a DUT 102. For charging the capacitance of the transmission line 104, the NC relay contact 126 of S1 is closed while the relay contacts of relays S2, S3 are both open. For discharging the charge on the transmission line 110 to form a test pulse, the NO relay contact 128 of S1 is closed to generate a test pulse. The NO contact 128 of S1 is then opened and the relay S2 is then closed to discharge any residual charge in the system.

After each test pulse is generated and applied to a wafer, the condition of the wafer is determined by a leakage current measurement with relays S1 and S2 open. Relay contact S3 is then closed to perform a leakage test.

Figure 4:
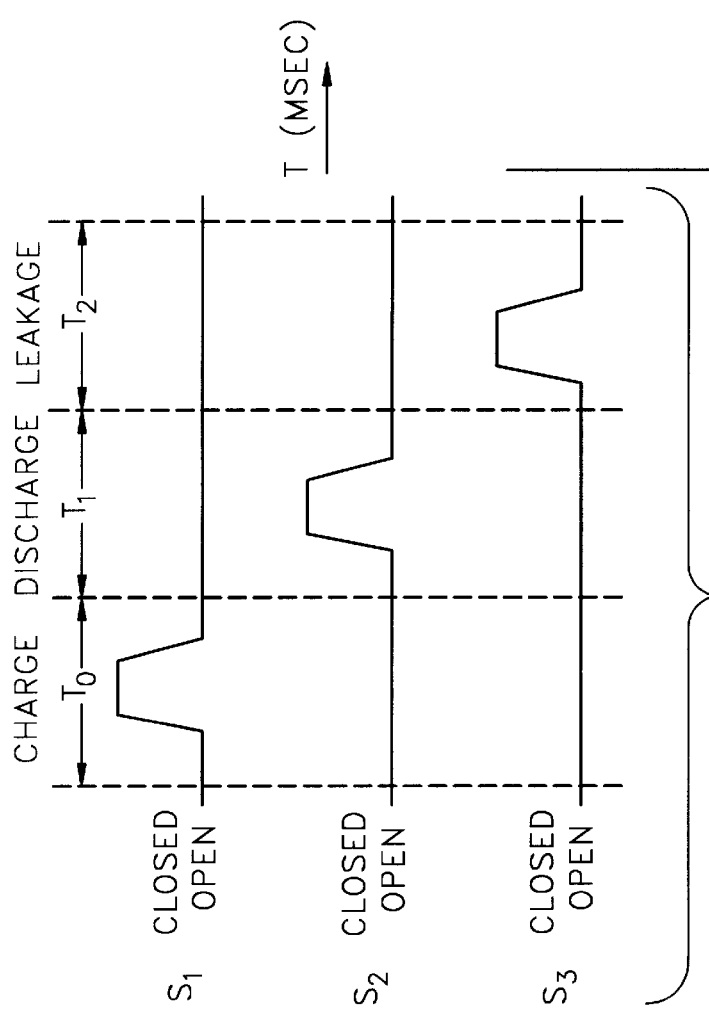
FIG. 4 is timing diagram for operation of the circuit of FIG. 3.

FIG. 4 illustrates a timing diagram for operation of the relays S1, s2, and S3 of FIG. 3B. Normally closed relay S1 discharges the transmission line 104 until just after time $t_o$, when the NO contacts of S1 is closed to discharge the transmission line 104 into the RF matching network 160, the transmission lines 190, 194, and the DUT 102. Relay S2 is closed just after time $t_1$ to discharge the system. Relay S3 is then closed just after time $t_2$ to allow leakage to be measured. The Figure shows that settling times are provided between the various operation intervals to allow settling of the relays and to maintain controlled isolation between the various circuit components connected to the relays.

FIGS. 5A and 5B are timing diagrams showing discharge voltage and current wave forms for a system according to the invention.

Figure 5:
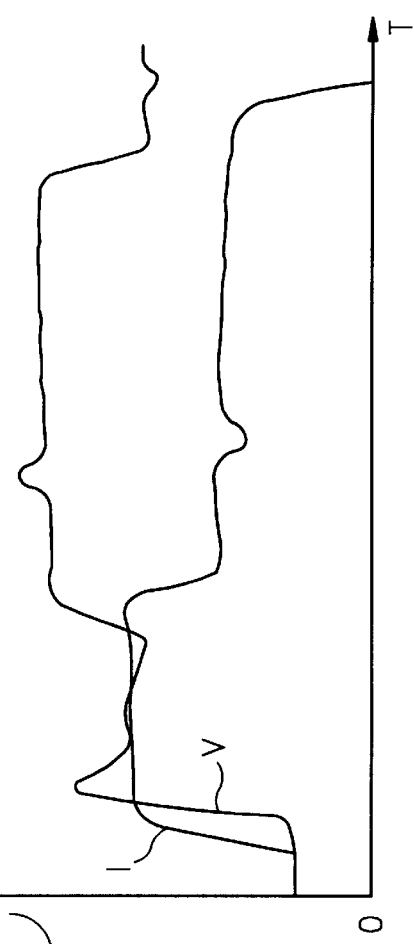
FIGS. 5A and 5B are timing diagrams showing discharge voltage and current wave forms for a system according to the invention.

FIG. 5 shows plots of exemplary voltage and current wave forms as would be measured by the oscilloscope 174 for the case where the impedance of the DUT is much less than the 50 ohm characteristic impedance of the transmission lines of the system. These plots show that, whereas previous test system used voltages of 250 volts peak, the present system is designed for operation with peak voltages of 2500 volts. Similarly, whereas the previous test system has currents of 5 amps, the present is designed for operation with peak currents of 39 amps.

The absolute value of the current and voltage reflection coefficients are the same. To find the dynamic impedance as a function of time for the DUT 144, the reflected voltage as a function of time is divided by the reflected current as a function of time, where the reflected voltage and reflected current are functions of time. This division is accomplished with, for example, an A/B input function for the display mode of an oscilloscope.

Figure 6A:
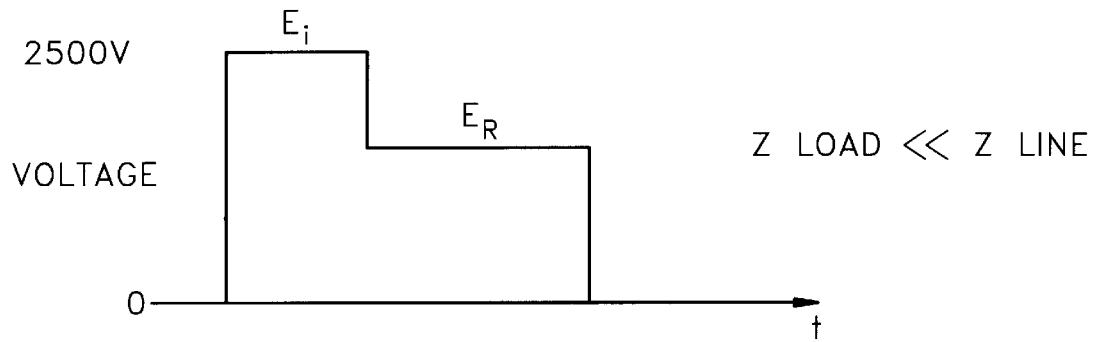
FIG. 6 shows plots of measured voltage and current wave forms using the system according to the invention.
Figure 6B:
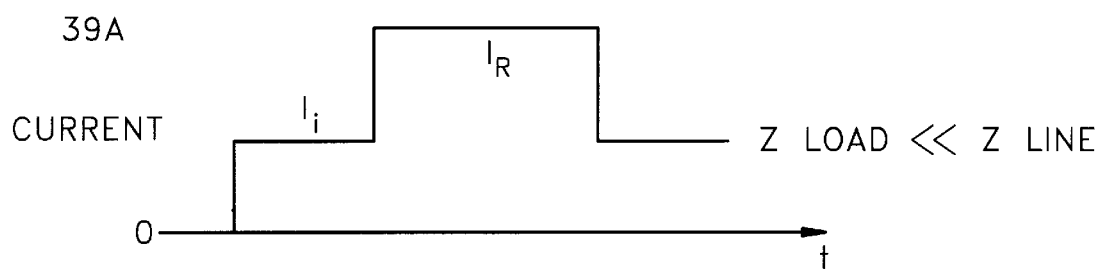

FIG. 6 shows plots of illustrative voltage V and current wave forms I as measured by the oscilloscope 174 using an RF matching circuit according to the invention. The time interval illustrated is 200 nanoseconds. The peak amplitude of the voltage waveform V is approximately 500 volts and the peak current I can range up to 40 amps. The respective "bumps" in the middle of the display represent impedance mis-match or reflections. The overshoot at the beginning of the voltage waveform indicates that these bumps would be much greater in a system not using an RF matching network.

Figure 7:
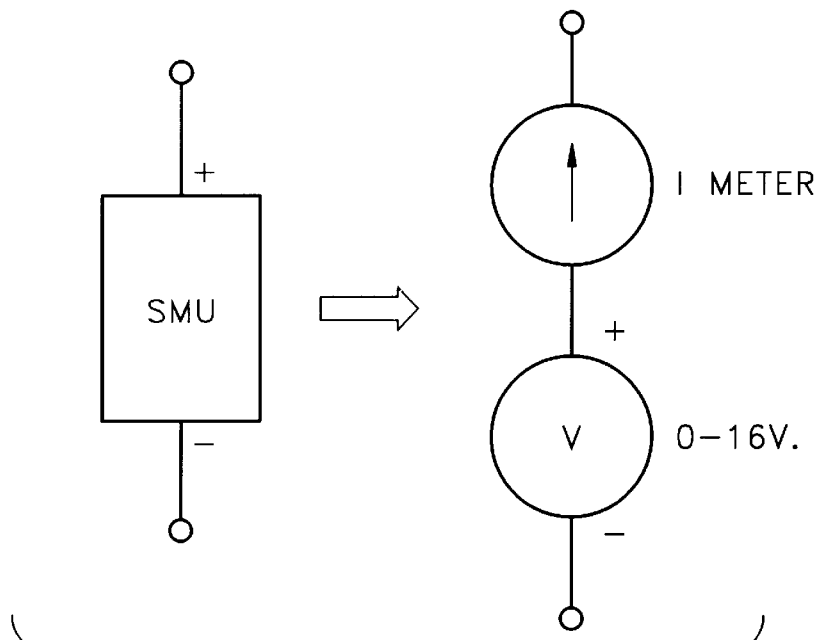
FIG. 7 is a circuit diagram of a stress measuring unit (SMU) which provides a fixed voltage and measures leakage current.

FIG. 7 shows an equivalent circuit for a Sense Measuring Unit (SMU) which is used for measuring leakage current and avoiding use of a voltage probe. The SMU is switched into the circuit after a test pulse is applied to the DUT with relay S3 and isolated from the pulse-forming elements of the circuit by relay S2. SMU's are provided by Keithly Instruments Company and Hewlett Packard Corporation. A typical SMU is the Hewlett Packard HP4145 Semiconductor Parametric Analyzer. This device can provide a forced voltage level and a current meter, as indicated in the Figure. The leakage of the DUT subsequent to a pulse being provided to the DUT is used to determine the effect of the test pulse on the condition of the DUT.

The foregoing descriptions of specific embodiments of the present invention have been presented for purposes of illustration and description.

They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the claims appended hereto and their equivalents.

I claim:

1. A pulse discharge circuit for pulse testing an integrated-circuit device under test (DUT), comprising:
   a first switch S1 having a common terminal with series inductance and a first contact terminal and a second contact terminal having series lead inductance;
   wherein the common terminal of the first switch S1 is connected to one end of a first conductor of a first transmission line and wherein a second end of the first conductor of the first transmission line is coupled to a stable, high-current termination resistance;

wherein the first contact terminal of the first switch S1 is connected to a high voltage source;

wherein the second contact terminal of the first switch S1 is connected to an input terminal of an RF matching network;

wherein the first switch S1 has a first charging position for connecting the common terminal to the first contact terminal to provide a conductive path for charging the first transmission line to a charged state from the high voltage source;

wherein said first switch S1 has a second discharging position for generating a test pulse and for connecting the common terminal to the second contact terminal and to the input terminal of the RF matching network, such that the test pulse propagates through the RF matching network and such that the impedance at the input terminal of the RF matching network is matched to the impedance of the first transmission line and the series inductances of the common terminal and the second contact terminal;

the RF matching network has an output terminal to which is connected one terminal of a second switch S2, wherein the second switch S2 has a second terminal which is connected to means for testing leakage;

wherein the output terminal of the RF matching network is connected to one terminal of a third switch S3, wherein a second terminal of said third switch S3 is connected to a ground reference potential;

the output terminal of the RF matching network is also connected to one end of a first conductor of a second transmission line;

wherein a second end of the first conductor of the second transmission line is connected to an integrated-circuit DUT;

means for measuring reflected voltage and reflected current from said integrated-circuit DUT at the output terminal of said RF matching network.

2. The system of claim 1 wherein the means for testing leakage of the DUT includes a sense measuring unit (SMU), wherein said SMU provides a voltage and a current to said DUT and wherein and means are provided for determining the voltage and current from the sense measuring unit to determine the leakage current of said DUT.

3. The system of claim 1 including means for dividing the measured reflected voltage as a function of time from the DUT by the measured reflected current as a function of time from the DUT to provide dynamic impedance for the point of the DUT being contacted with the probe.

4. A pulse discharge system for testing a device under test (DUT), comprising:

a first switch S1 having a common terminal with series inductance and a first contact terminal and a second contact terminal having series lead inductance;

wherein the common terminal of the first switch S1 is connected to one end of a first conductor of a first transmission line and wherein a second end of the first conductor of the first transmission line is coupled to a stable, high-current termination resistance;

wherein the first contact terminal of the first switch S1 is connected to a high voltage source;

wherein the second contact terminal of the first switch S1 is connected to an input terminal of an RF matching network;

wherein the first switch S1 has a first charging position for connecting the common terminal to the first contact terminal to provide a conductive path for charging the first transmission line to a charged state from the high voltage source;

wherein said first switch S1 has a second discharging position for generating a test pulse and for connecting the common terminal to the second contact terminal and to the input terminal of the RF matching network, such that the test pulse propagates through the RF matching network and such that the impedance at the input terminal of the RF matching network is matched to the impedance of the first transmission line and the series inductances of the common terminal and the second contact terminal;

the RF matching network has an output terminal to which is connected one terminal of a second switch S2, wherein the second switch S2 has a second terminal which is connected to means for testing leakage;

wherein the output terminal of the RF matching network is connected to one terminal of a third switch S3, wherein a second terminal of said third switch S3 is connected to a ground reference potential;

the output terminal of the RF matching network is also connected to one end of a first conductor of a second transmission line;

wherein a second end of the first conductor of the second transmission line is connected to an integrated-circuit DUT;

means for measuring reflected voltage and reflected current from said DUT at the output terminal of said RF matching network;

a controller including means for operating the first switch S1, the second switch S2, and the third switch S3;

voltage sensor means coupled to the output terminal of the RF matching circuit for measuring any reflected voltage which propagates from the DUT as a result of the pulse applied to the DUT;

current sensor means coupled to the output terminal of the RF matching circuit for measuring any reflected current which propagates from the DUT as a result of the pulse applied to the DUT.

5. The system of claim 4 including means for dividing the measured reflected voltage as a function of time from the DUT by the measured reflected current as a function of time from the DUT to provide dynamic impedance for a point of the DUT being contacted with a test probe connected to the second end of the first conductor of the second transmission line.

* * * * *